United States Patent
Saito (10) Patent No.: US 6,713,163 B2
(45) Date of Patent: Mar. 30, 2004

(54) MULTILAYERED PRINTED WIRING BOARD

(75) Inventor: Shigemasa Saito, Kanagawa (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 10/334,103

(22) Filed: Dec. 31, 2002

(65) Prior Publication Data

US 2004/0018348 A1 Jan. 29, 2004

(30) Foreign Application Priority Data

Jul. 29, 2002 (JP) .......................... 2002-219217

(51) Int. Cl.$^7$ ................................. B32B 3/00
(52) U.S. Cl. ................. 428/209; 174/258; 174/263; 174/266; 428/901
(58) Field of Search .................. 428/209, 901; 174/258, 263, 266

(56) References Cited

U.S. PATENT DOCUMENTS

| | | | |
|---|---|---|---|
| 6,403,221 B1 * | 6/2002 | Nakamura et al. | 428/416 |
| 2002/0182958 A1 * | 12/2002 | Tani et al. | 442/180 |
| 2002/0187353 A1 * | 12/2002 | Nakamura et al. | 428/416 |
| 2003/0022958 A1 * | 1/2003 | Watanabe et al. | 522/168 |

FOREIGN PATENT DOCUMENTS

| | | |
|---|---|---|
| JP | 2000-290474 | 10/2000 |
| JP | 2001-164094 | 6/2001 |

OTHER PUBLICATIONS $8^{th}$ Symposium on "Microjoining and Assembly Technology in Electronics", Jan. 31–Feb. 1, 2002, Yokohama.

* cited by examiner

*Primary Examiner*—Cathy Lam (57) ABSTRACT

A fire retardant multilayered printed wiring board without halogen compounds, having enhanced thermal conductivity of insulator layers to prevent electronic components from being damaged during soldering. The insulator layers are formed of a glass cloth impregnated with an epoxy resin composition. Metal foil layers, in each of which a circuit is formed, are laminated alternately with the insulator layers. The epoxy resin composition includes at least phosphate ester, aluminum hydroxide, silica, calcium oxide, strontium titanate, and iron oxide. Inorganic components are provided in the insulator layers as about 8% to about 18% by mass of $P_2O_5$, about 20% to about 28% by mass of $Al_2O_3$, about 0.1% to about 0.6% by mass of $SiO_2$, about 0.1% to about 1.0% by mass of Cl, about 15% to about 20% by mass of CaO, about 0.3% to about 0.5% by mass of $TiO_2$, about 0.2% to about 0.4% by mass of $Fe_2O_3$, and about 0.1% to about 0.3% by mass of SrO, in converted values as measured by an X-ray fluorescence analysis.

32 Claims, 4 Drawing Sheets

MULTILAYERED PRINTED WIRING BOARD

CROSS-REFERENCE TO RELATED APPLICATION

This application is related to, and claims priority to, Japanese Application No. JP 2002-219217 filed Jul. 29, 2002, the disclosure of which is incorporated herein by reference.

BACKGROUND OF THE INVENTION

1. Field of the Invention

The present invention relates to a printed wiring board for surface mounting electronic parts, and, more particularly, to a multilayered printed wiring board having insulator layers made of a glass cloth and an epoxy resin.

2. Description on the Related Art

Examples of a printed wiring board for surface mounting electronic parts include a copper-clad paper phenol laminate referred to as FR-1, a copper-clad composite laminate referred to as CEM-3, a resin sheet with a copper foil referred to as RSC used in layering board, a multilayered copper-clad glass epoxy laminate referred to as FR-4 according to the NEMA (National Electrical Manufacturers Association, U.S.) Standard, etc. Of these examples, the multilayered copper-clad glass epoxy laminate referred to as FR-4 is a multilayered printed wiring board having insulator layers made of glass cloth and epoxy resin. The wiring boards have become a main component mounted in such apparatuses as personal computers, cellular phones, etc.

The temperature of the printed wiring board becomes high in some electric circuits. Thus, fire retardant materials are required to prevent fires. Standards of fire retardancy exist, such as UL94-V0.

Halogen has been used to make printed wiring boards fire retardant. Fire retardant components such as halogen are generally added to or made to react with resin. Such fire retardant additives provide high fire retardancy and generate halogenated radicals, mainly due to pyrolysis, which capture inorganic radicals that are combustion sources to stop chain reactions resulting in combustion.

In the copper-clad glass epoxy laminate like the above-described FR-4, an insulator layer is made of glass cloth and epoxy resin, such as chlorinated epoxy resin or brominated epoxy resin.

However, a fire retardant additive that includes a large amount of halogen compound, such as brominated epoxy resin, may generate dioxin under certain combustion conditions. Therefore, because of environmental protection concerns, there is a need to reduce the amount of halogen. In addition, another problem exists in that liberated halogen ions can migrate into the copper foil layer, causing a phenomenon referred to as migration that induces corrosion of the copper foil layer, on which a circuit is formed.

Fire retardant board material with a reduced amount of halogen is disclosed in, for example, Japanese Patent Application Publication No. JP-2001-164094, in which a fire retardant insulating epoxy composition is used as an insulator film for layers, and provides fire retardancy and insulation characteristics required for a circuit board. The composition includes epoxy resin, a curing agent for the epoxy resin, resorcinol phosphate ester, aluminum hydroxide, and an epoxy curing agent.

Also, in Japanese Patent Application Publication No. JP-2000-290474, a hardening resin composition having sufficient fire retardancy characteristics is disclosed that contains polyphenylene ether resin, bisphenol A epoxy resin, novolak phenolic resin, melamine or guanamine, phosphorus compound, and inorganic filler.

In the compositions disclosed in the above-described JP-2001-164094 and JP-2000-290474, fire retardancy is provided by inorganic components such as phosphorus compound, aluminum hydroxide, etc., which enables the reduction of halogen.

However, in the fire retardant insulating epoxy composition disclosed in JP-2001-164094, a layered printed wiring board is made without using glass cloth. Thus, the composition cannot be directly applied to the multilayered copper-clad glass epoxy laminate. Moreover, the combination of phosphorus ester and aluminum hydroxide makes it difficult to obtain the fire retardancy equivalent to that in UL-V0. Thus, fire retardancy may be insufficient in the composition disclosed in JP-2001-164094.

In addition, in the resin composition disclosed in JP-2000-290474, the composition and mixing amounts of the inorganic fillers are not limited and, thus, insufficient fire retardancy may result.

Furthermore, in each of the compositions disclosed in the above-described JP-2001-164094 and JP-2000-290474, a problem exists of providing low thermal conductivity of the insulator layer. In general, inorganic fillers such as aluminum hydroxide may cause secondary flocculation on the order of 10 to 20 $\mu$m. The flocculation is also caused when inorganic fillers are distributed in the resin. Thus, it is difficult to uniformly distribute inorganic fillers in the insulator layer.

Consequently, in the above-described conventional compositions, some portions of the insulator layer have been formed rich in resin. This reduces thermal conductivity of the insulator layer to cause insufficient dissipation of heat when electronic parts are soldered by, for example, a reflow furnace. Thus, electronic parts may be damaged.

Further, for the multilayered printed wiring board, recent downsizing and performance improvement thereof have caused the operating conditions to become severe. Thus, improvement in manufacturing reliability and thermal properties of the board are required. For example, through-holes are provided for continuity between metal foil layers laminated alternately with insulator layers. The ability to drill the through-holes through the insulator layers may be reduced when the amount of added inorganic fillers is increased to ensure fire retardancy. Therefore, improved drilling machinability is needed when adding inorganic fillers such as those described above.

SUMMARY OF THE INVENTION

It is an aspect of the present invention to provide a fire retardant multilayered printed wiring board that reduces the amounts of halogen compounds used, with enhanced thermal conductivity of the insulator layers to prevent electronic components from being damaged during soldering, and that has excellent drilling machinability for forming through-holes.

Additional aspects and advantages of the invention will be set forth in part in the description that follows, and, in part, will be obvious from the description, or may be learned by practice of the invention.

To achieve the above and/or other aspects according to the present invention, there is provided a multilayered printed wiring board having insulator layers that are formed with a glass cloth impregnated with an epoxy resin composition, and metal foil layers in which a circuit is formed. The insulator layers are laminated alternately with the metal foil layers so that each of the insulator layers is sandwiched between the two metal layers. Through-holes are formed to provide continuity between the metal foil layers laminated with the insulator layers placed therebetween. The epoxy resin composition includes at least phosphate ester, aluminum hydroxide, silica, calcium oxide, strontium titanate, and iron oxide. Amounts of inorganic components in the insulator are provided in the ranges of about 8% to about 18% by mass of phosphorus pentoxide ($P_2O_5$), about 20% to about 28% by mass of aluminum oxide ($Al_2O_3$), about 0.1% to about 0.6% by mass of silica ($SiO_2$), about 0.1% to about 1.0% by mass of chlorine (Cl), about 15% to about 20% by mass of calcium oxide (CaO), about 0.3% to about 0.5% by mass of titanium oxide ($TiO_2$), about 0.2% to about 0.4% by mass of iron oxide ($Fe_2O_3$), and about 0.1% to about 0.3% by mass of strontium oxide (SrO), in converted values as measured using X-ray fluorescence analysis.

Phosphate ester and aluminum hydroxide in the amounts as described above provide fire retardancy while reducing the amounts of halogen compounds used.

Silica, calcium oxide, strontium titanate, and iron oxide are contained in the above-described proportions to prevent secondary flocculation of aluminum hydroxide in the insulator layers and to enhance thermal conductivity of the insulator layers, which can prevent electronic components from being damaged during soldering.

Because the amounts of the inorganic components used are low, drilling machinability in forming through-holes is not reduced.

The aluminum hydroxide component contains particles with irregular shapes having an average particle diameter of about 0.5 μm to about 1.0 μm that are approximately uniformly distributed in the insulator layers. This prevents the aluminum hydroxide particles from causing secondary flocculation to further enhance thermal conductivity of the insulator layer.

At specified sections in the metal foil layers and through-holes, solder layers are formed that do not contain lead. Thus, the multilayered printed wiring board according to aspects of the present invention is lead-free in addition to having less halogen, which reduces environmental pollution.

A surface of the multilayered printed wiring board, except for sections to be soldered, is coated with an insulation material containing phthalocyanine blue. This removes halogen from the resist coat material on the surface of the wiring board, which reduces the amount of environmental pollution.

Amounts of gases evolved by a burning test at 600° C., as specified under JIS-K7217, are about 150 μg/g or less of chlorine, about 30 μg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board. This suppresses the production of injurious halogen and dioxin during soldering.

Also, thermal conductivity of the insulator layers is about 0.4 to 0.5 W/m/K. The high thermal conductivity of the insulator layers prevents electronic components from being damaged during soldering.

BRIEF DESCRIPTION OF THE DRAWINGS

Additional aspects and advantages of the present invention will become apparent and more readily appreciated from the following description of the embodiments, taken in conjunction with the accompanying drawings, of which.

DETAILED DESCRIPTION OF THE PREFERRED EMBODIMENTS

Hereinafter, embodiments of the present invention will be described in detail with reference to the attached drawings, wherein the like reference numerals refer to the like elements throughout. The present invention may, however, be embodied in many different forms and should not be construed as being limited to the embodiments set forth herein; rather, these embodiments are provided so that the present disclosure will be thorough and complete, and will fully convey the concept of the invention to those skilled in the art.

Figure 1:
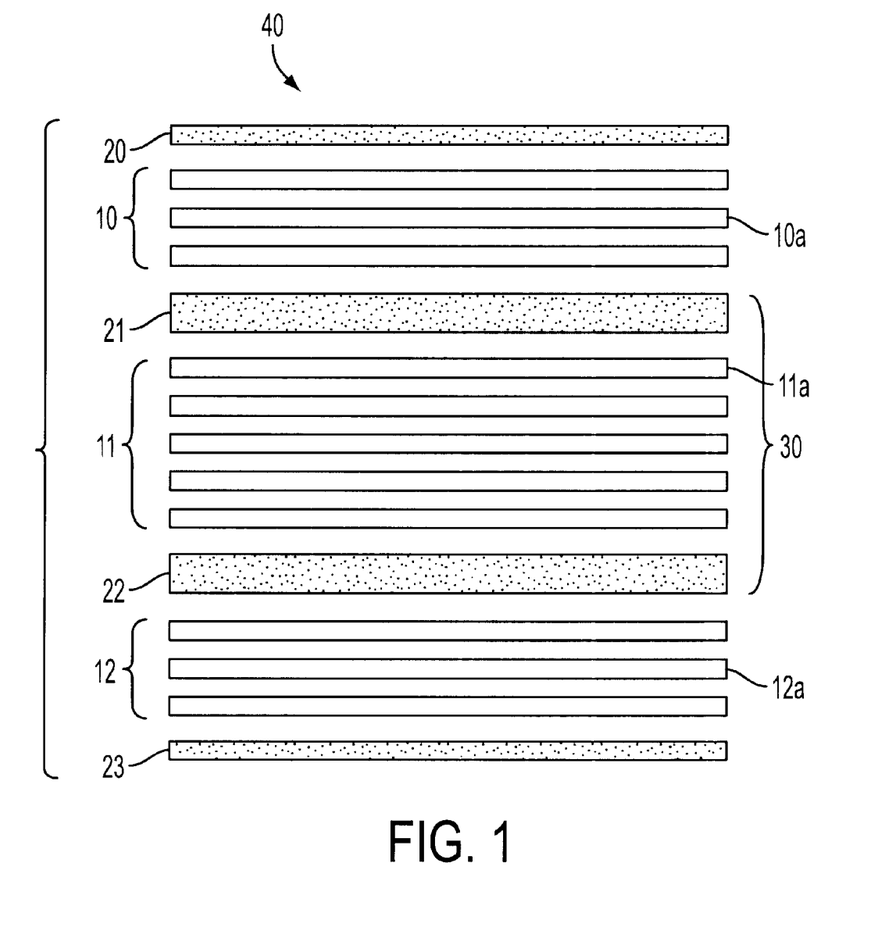
FIG. 1 is a schematic view showing a laminated structure of a multilayered printed wiring board according to an embodiment of the present invention.

FIG. 1 and FIGS. 2a through 2i illustrate a method of manufacturing the multilayered printed wiring board according to an embodiment of the present invention. FIG. 1 is a schematic view showing the laminations of the multilayered printed wiring board according to an embodiment of the present invention, and FIGS. 2a through 2i are schematic process diagrams of the method of manufacturing the multilayered printed wiring board according to an embodiment of the present invention.

As shown in FIG. 1, the multilayered printed wiring board 40 has alternating insulator layers 10, 11, 12 and metal foil layers 20, 21, 22, 23, with the metal foil layers 20–23 being disposed on either side of the insulator layers 10, 11, 12, forming a four-layer plate structure with four layers of the metal foil layers 20–23. The number of laminations of the multilayered printed wiring board is not limited. Thus, a six-layer structure for example, may be formed using additional insulator layers and metal foil layers.

Each insulator layer 10–12 includes a plurality of prepregs, each being a glass cloth impregnated with an epoxy resin composition. In FIG. 1, the central insulator layer 11 is laminated with five prepregs 11a, and the insulator layers 10 and 12 are laminated with three prepregs 10a and 12a, respectively.

A conventional glass fiber fabric can be used for the glass cloth. Examples include a glass cloth with glass yarn of G75 1/0 as specified under JIS-R3413, having a number of yarns per inch of 44×32, a glass cloth with glass yarn of DE150 1/0 having a number of yarns per inch of 60×50, a glass cloth with glass yarn of E225 1/0 having a number of yarns per inch of 60×58, a glass cloth with glass yarn of D450 1/0 having a number of yarns per inch of 60×47.

The epoxy resin composition includes at least phosphate ester, aluminum hydroxide, silica, calcium oxide, strontium titanate, and iron oxide.

Bifunctional epoxy resin such as bisphenol A epoxy resin, bisphenol F epoxy resin, and multifunctional epoxy resin such as phenolic novolak epoxy resin, cresol novolak epoxy resin, bisphenol A novolak epoxy resin, bisphenol F novolak epoxy resin, naphthalene epoxy resin, biphenyl epoxy resin, dicyclopentadiene epoxy resin, etc. can be used for the epoxy resin. Either a bifunctional or a multifunctional epoxy resin may be used, or a combination thereof. An aromatic epoxy resin may be used, in particular, bisphenol A epoxy resin.

The epoxy resin is chlorinated with, for example, low chlorinated bisphenol A to enhance fire retardancy. Examples of hardeners include phenolic resin and, in particular, phenolic novolak resin. A resin having toughness with low brittleness increases the metal foil layer peel-off strength, and inhibits the evolution of NOx.

The phosphate ester also provides fire retardancy according to embodiments of the present invention. The phosphate ester is pyrolytically decomposed to produce phosphoric acid, polyphosphoric acid, and polymetaphosphoric acid having dehydration-carbonization-catalytic actions to form an oxide layer on the surface of the resin, which enhances fire retardancy. The phosphate ester includes bisphenol phosphate ester, for example, and, in particular, resorcinol phosphate ester to ensure fire retardancy.

The aluminum hydroxide component is pyrolytically decomposed to release water of crystallization, which suppresses the oxidation reaction by the cooling effect of the water. The aluminum hydroxide contains particles with irregular shapes having an average particle diameter of about 0.5 $\mu$m to about 1.0 $\mu$m, which are approximately uniformly distributed in the insulator layers 10–12. This prevents the aluminum hydroxide particles from secondary flocculation to enhance thermal conductivity of the insulator layers 10–12.

The shapes of the particles include spherical as well as needle and flat plate shapes. The aluminum hydroxide component is obtained by dispersing aluminum hydroxide by a zirconia coated bead mill, for example.

Aluminum hydroxide with an average particle diameter less than about 0.5 $\mu$m may cause secondary flocculation, which results in nonuniform dispersion in the insulator layers 10–12 that reduces thermal conductivity of the insulator layers 10–12. Average particle diameter exceeding 1.0 $\mu$m causes a resin-rich layer with low heat-resistance because epoxy resin is formed between the aluminum hydroxide particles to reduce heat-resistance to soldering and fire-resistance characteristics.

At least silica, calcium oxide, strontium titanate, and iron oxide are further included in the epoxy resin composition as inorganic components.

By combining a plurality of the inorganic components, when melting, flowing, and solidifying the resin during laminating the insulator layers 10–12, uneven distribution of aluminum hydroxide and epoxy resin, which is caused by a difference in the physical properties of the materials, for example, by the formation of large resin rich layers, may be prevented. To secure fire-resistance characteristics, adhesion, strength, electrical characteristics, etc., the average particle diameters of the inorganic components are 1 $\mu$m or less.

Amounts of inorganic components in the insulator are provided in the ranges of about 8% to about 18% by mass of phosphorus pentoxide ($P_2O_5$), about 20% to about 28% by mass of aluminum oxide ($Al_2O_3$), about 0.1% to about 0.6% by mass of silica ($SiO_2$), about 0.1% to about 1.0% by mass of chlorine (Cl), about 15% to about 20% by mass of calcium oxide (CaO), about 0.3% to about 0.5% by mass of titanium oxide ($TiO_2$), about 0.2% to about 0.4% by mass of iron oxide ($Fe_2O_3$), and about 0.1% to about 0.3% by mass of strontium oxide (SrO), in converted values as measured using X-ray fluorescence analysis.

By providing the inorganic components in the above-described amounts, fire retardancy can be provided while reducing the amounts of the halogen compounds used, and thermal conductivity of the insulator layers 10–12 can be enhanced to prevent electronic components from being damaged during soldering.

The inorganic components in the insulator layers 10–12 of the manufactured multilayered printed wiring board are provided in converted values as measured by X-ray fluorescence analysis. By using values measured by X-ray fluorescence analysis, the kinds of, and amounts of, the inorganic components can be accurately determined after the multilayered printed wiring board is manufactured.

Moreover, the values measured by X-ray fluorescence analysis are measured depth-wise from the surface of the insulator layers 10–12 to several tens of micrometers. Therefore, the compositions around the surfaces of the insulator layers 10–12, which are directly related to the fire retardancy of the insulator layers 10–12, are measured in the above-described amounts.

Specific measurements are carried out by qualitative analyses of the inorganic components using X-ray fluorescence analysis and by quantitative analyses using a relative intensity method and X-rays of a reference material. The quantitative analysis is performed by preparing a calibration curve for every component or by using a so-called FP method in which an amount of a component is determined by comparing the intensity of reference fluorescent X-rays with a measured intensity.

In X-ray fluorescence analysis, only the amounts of the inorganic components in the above-described measuring range are directly determined. Therefore, a value measured for phosphate ester is converted to a value for phosphorus pentoxide ($P_2O_5$). Also, a value measured for aluminum hydroxide is converted to a value for aluminum oxide ($Al_2O_3$), including the aluminum oxide included in the glass cloth components.

The amount of aluminum hydroxide is calculated by subtracting from the total weight of an insulator layer, the weight of a glass cloth base of the same size, amounts of inorganic materials obtained by ignition loss measurement, and an amount of phosphorus pentoxide measured by the X-ray fluorescence analysis.

The weight of the glass cloth base can be obtained by immersing aluminum hydroxide adhered and adsorbed to the glass cloth in perchloric acid solution and carrying out ultrasonic cleaning thereof to remove the aluminum hydroxide. A method of determining an amount of aluminum hydroxide is described in related Japanese Patent Application Publication No. JP-2002-6823.

Values for silica ($SiO_2$) and calcium oxide (CaO) include amounts for silica and calcium oxide that are in the glass cloth components. For example, the amount of calcium oxide (CaO) of about 14.7% to about 19.5% by mass in the glass cloth, and about 0.3% to about 0.5% by mass in the epoxy resin, are summed for a total of about 15% to about 20% by mass.

Various kinds of additives can be used in the epoxy resin composition in addition to the above-described additives, such as a silane coupling agent, an anti-oxidizing agent, a cure accelerating agent, various kinds of modifiers, etc.

To manufacture the epoxy resin composition, a raw material epoxy resin used as a base resin is dispersed by a bead mill with aluminum hydroxide, silica, calcium oxide, strontium titanate, and iron oxide added thereto, before being solved in a solvent such as phosphate ester, polypropylene glycol monomethyl ether (PGM) or methyl ethyl ketone (MEK).

The components are mixed so that the contents become about 160 to about 180 parts by mass of epoxy resin, about 17.1 to about 38.4 parts by mass of phosphate ester, about 44.9 to about 62.8 parts by mass of aluminum hydroxide, about 0.15 to about 0.9 parts by mass of silica, about 0.3 to about 0.5 parts by mass of calcium oxide, about 0.29 to about 0.59 parts by mass of iron oxide, and about 0.53 to about 1.17 parts by mass of strontium titanate. The mass of the epoxy resin is a sum of the mass of the base resin and the curing agent. Then, the amounts of the inorganic components in each insulator layer are obtained by the X-ray fluorescence analysis.

The glass cloth is impregnated with the epoxy resin composition using a conventional impregnating apparatus to provide a prepreg. Conventional drying methods may be used. The amount of impregnation is about 48% to about 52% by mass of a prepreg. An amount of impregnation of about 48% by mass or less may cause a gap to develop at an interface with the metal foil layers 20–22. An amount of impregnation exceeding about 52% by mass may cause the resin to squeeze out, resulting in nonuniform thickness.

To manufacture the multilayered printed wiring board according to embodiments of the present invention using the prepregs 10a–12a, first, as shown in FIG. 1, several of the prepregs 11a are laminated (five prepregs 11a are laminated in the embodiment shown in FIG. 1) and the metal foil films 21 and 22 are laminated on either side of the five prepregs 11a. The layers thus far laminated are integrated by heating and pressing to form an inner layer board 30. This hardens a plurality of the prepregs 11a to form the insulator layer 11. Copper foils, for example, of about 18 μm to about 70 μm may be used as the metal foil layers 21 and 22.

Figure 2A:
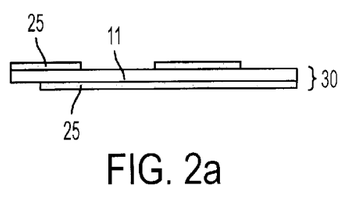
FIG. 2 is a schematic process diagram showing a method of manufacturing the multilayered printed wiring board according to an embodiment of the present invention.

As shown in FIG. 2a, the metal foil layers 21 and 22 are subjected to etching to form inner layer circuits 25 on both faces of the inner layer board 30. An etching method using a conventional photosensitive resist material, for example, may be used.

Figure 2B:
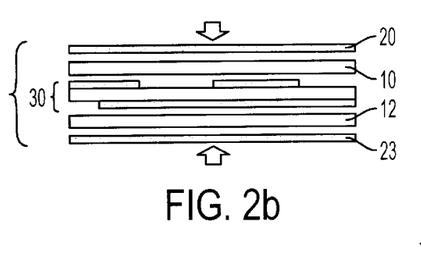

As shown in FIG. 1 and FIG. 2b, a plurality of the prepregs 10a and 12a are laminated on both faces of the inner layer board 30. In the embodiment shown in FIG. 1, the prepregs 10a and 12b are used in the insulator layers 10 and 12, respectively. The metal foil layers 20 and 23 are laminated on the outside faces of the insulator layers 10 and 12, respectively. The layers thus far laminated are integrated by heating and pressing to form the board 40. This hardens a plurality of the prepregs 10a and 12a to form the insulator layers 10 and 12, respectively.

Figure 2C:
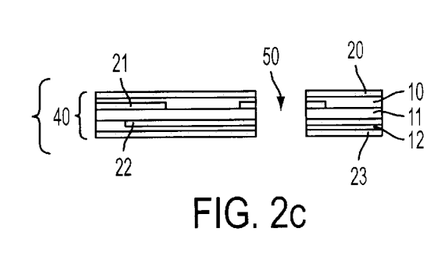
Figure 2D:
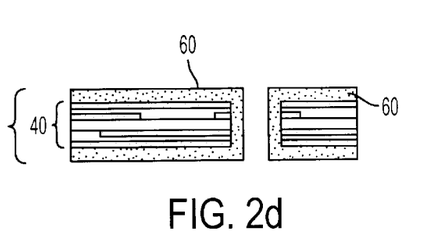

As shown in FIGS. 2c and 2d, to provide continuity for the metal foil layers 20, 21, 22, and 23 alternately laminated with the insulator layers 10, 11, and 12, a through-hole 50 is provided by drilling, for example (FIG. 2c). To provide continuity for the through-hole 50, the whole board 40 is plated with plated layer 60 (FIG. 2d). Conventional copper plating, for example, may be used for the plated layer 60. To inhibit oxidation of the copper surface due to heating during soldering and, thereby, ensure wetting by the solder, two or more of the plated layers 60 can be provided. For example, a gold Au flashing can be provided on a nickel Ni plating.

The through-hole 50 provides continuity for the circuits of all the metal foil layers 20–23. The through-hole 50 also provides a hole for inserting and soldering a lead of an electronic component. The amounts of the inorganic components being within the above-described ranges results in no deterioration in drilling machinability.

Figure 2E:
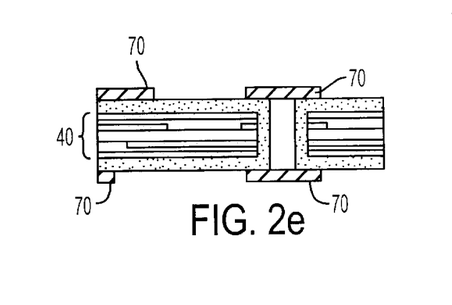
Figure 2F:
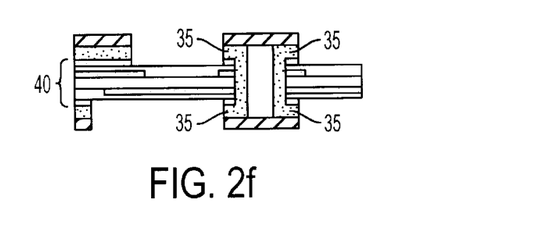
Figure 2G:
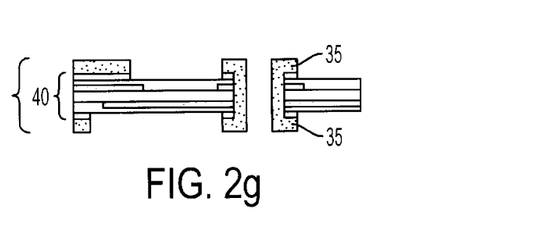

As shown in FIGS. 2e through 2g, both of the metal foil layers 20 and 23 are masked with a dry film 70 (FIG. 2e). Thereafter, the plated layer 60 and the metal foil layers 21 and 22 are etched to form outer layer circuits 35 on both faces of the board 40 (FIG. 2f). After this, the dry films 70 are removed (FIG. 2g).

Figure 2H:
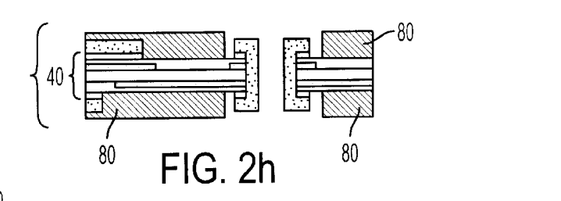

To prevent solder from spreading out of sections that are soldered, portions other than the sections to be soldered are coated with solder resists 80 (FIG. 2h). Lead terminals of electronic components are directly soldered onto the outer layer circuits 35, as well as to the through-hole 50.

The solder resists 80 contain phthalocyanine blue, which removes halogen from the solder resists 80 on the surface of the wiring board 40 to reduce environmental pollution.

Figure 2I:
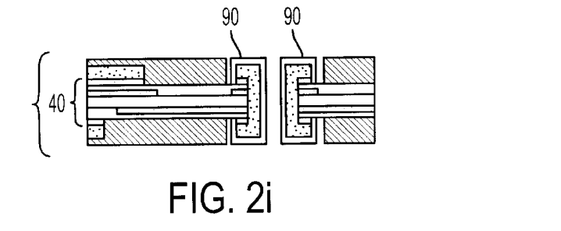

Finally, on the sections to be soldered, (i.e., on the plated layers 60 exposed to the surface), solder coating 90 is applied to enhance adhesion to solder (FIG. 2i). The solder coating 90 does not contain lead. This provides a lead-free multilayered printed wiring board 40, which further reduces environmental pollution. A Sn—Ag—Cu alloy, a Sn—Zn—Bi alloy, a Ni—Au alloy, etc. may be used for the solder coating 90.

Thus, the multilayered printed wiring board according to embodiments of the present invention obtained by the above manufacturing method is provided with fire retardancy while reducing amounts of halogen compounds used. Thermal conductivity of the insulator layers is enhanced, which prevents electronic components from being damaged during soldering. Also, the ability to form through-holes is not impaired.

The amounts of injurious gases evolved by the burning test at 600° C., as specified under JIS-K7217, are about 150 μg/g or less of chlorine, about 30 μg/g or less of bromine, about 5 μg/g or less of hydrogen cyanide, and about 5 pg/g or less of polychlorinated dibenzo-p-dioxin and polychlorinated dibenzo furan in mass ratio to the multilayered printed wiring board.

The methods used for measuring concentrations of chlorine and bromine are those specified under JPCA-ES-01-1999, published by the Japan Printed Circuit Association.

The multilayered printed wiring board is burned at 600° C. in an oxygen concentration of 21% and a flow rate of supplied gas of 1.5 L/min. Soot and gases evolved from burning are caught by a quartz cylinder filter paper, diethylene glycol, and XAD-2 resin, and analyzed by a GC/MS to measure concentrations of hydrogen cyanide (HCN), and PCDD and PCDF as chlorinated dioxin.

The thermal conductivity of the insulator layers of the multilayered printed wiring board according to embodiments of the present invention is about 0.4 to about 0.5 W/m/K. The thermal conductivity is measured by a laser flash method at about 25° C. in a vacuum environment.

Because of the high thermal conductivity of the insulator layers, electronic components are not damaged during soldering.

For a conventional multilayered printed wiring board, which has low thermal conductivity of the insulator, the soldering temperature is made high to increase productivity, generally 40° C. to 50° C. higher than the melting point of the solder.

Such a high temperature setting, which considerably exceeds the melting point of the solder, enhances thermal stresses in electronic components and damages the electronic components. Also, an elevated heating temperature prolongs the solidification time of the solder material and causes fillet peeling (lift-off) phenomenon, for example, when lead-free solder with a high melting point is used, which results in a possible decrease in reliability at a soldered portion.

Because a multilayered printed wiring board according to embodiments of the present invention has a high thermal conductivity, a lower heating temperature for soldering can be set. This decreases thermal stress and prevents damage to electronic components. Also, the solder solidifies faster so that the peeling phenomenon is less likely to occur, which increases reliability at a soldered portion.

EXAMPLES

Embodiments of the present invention are further illustrated with reference to the following examples, which are provided for illustration of the invention and are not intended to be limiting thereof.

Example 1

By the manufacturing process illustrated in FIGS. 2a through 2i, a multilayered printed wiring board with a four-layer structure, as shown FIG. 1, was manufactured.

The Base Resin. A base resin was prepared by dispersing the following using a bead mill: low chlorinated bisphenol A epoxy resin (manufactured by Asahi Denka Kogyo K.K. under the trade name of KRM2414) of 60 parts by mass, high fire retardant polyfunctional cresol-novolak epoxy resin (manufactured by Asahi Denka Kogyo K.K. under the trade name of KRM2650) of 40 parts by mass, rubber modified epoxy resin (manufactured by Asahi Denka Kogyo K.K. under the trade name of KRM2423) of 10 parts by mass, fire retardant aluminum hydroxide with a 30 µm average particle diameter (manufactured by Nippon Light Metal Co., Ltd. under the trade name of B303) of 49.35 parts by mass, silica with a 20 µm average particle diameter (manufactured by Nippon Steel Chemical Co., Ltd. under the trade name of M-20) of 0.6 parts by mass, calcium oxide with a 0.3 µm average particle diameter (manufactured by Nippon Sekkai Kogyo-sho Co., Ltd. under the trade name of CALCIA) of 0.5 parts by mass, strontium titanate with a 1.0 µm average particle diameter (manufactured by Fuji Titanium Industry Co., Ltd. under the trade name of HPSF-2) of 0.9 parts by mass, and iron oxide with a 400 Å average particle diameter (manufactured by Sumitomo Cement Co., Ltd. under the trade name of FERRITE) of 0.44 parts by mass.

The Epoxy Resin. An epoxy resin was prepared by solving the following: resorcinol phosphate ester as a high sensitive phosphate ester (manufactured by Asahi Denka Kogyo K.K. under the trade name of FP-500) of 29.70 parts by mass, high strength phenol novolak resin (manufactured by Dainippon Ink and Chemicals Inc. under the trade name of EPICRON N-770) of 57.36 parts by mass, and a curing catalyst (manufactured by Asahi Denka Kogyo K.K. under the trade name of EH-4339S) of 0.9 parts by mass. The solvent included propylene glycol monomethyl ether acetate (PGMAC) and methyl ethyl ketone (MEK).

Preparation of the Prepreg. Glass cloth (manufactured by Asahi Schwebel Co. Ltd. under the trade name of STYLE 1560) was impregnated with the epoxy resin composition and dried using a vertical drying oven to produce a prepreg with a thickness of 0.18 mm.

Manufacture of the Multilayered Printed Wiring Board. According to the manufacturing process shown in FIGS. 2a through 2i, copper foil with a thickness of 70 µm was used for each metal foil layer 21 and 22. The metal foil layers 21 and 22 were laminated on either side of a laminated composition including five of the prepregs. A vacuum hot-press of the prepregs was performed at 170° C. for 70 minutes to form the inner layer board 30. The metal foil layers 21 and 22 were etched to form the inner layer circuits 25 on both surfaces of the inner layer board 30.

Three prepregs were laminated on an upper surface of the metal layer 21 to form the insulator layer 10, and another three prepregs were laminated on a lower surface of the metal layer 22 to form the insulator layer 12. Metal foil layers 20 and 23 were laminated on an upper surface of insulator layer 10 and a lower surface of insulator 12, respectively. A vacuum hot-press at 170° C. for 70 minutes was applied to form the board 40 having a four-layer structure with a thickness of 1.6 mm.

The through-hole 50 was formed by drilling through the board 40. Then, the whole board 40 was copper plated to form the plated layer 60 for continuity. The metal foil layers 20 and 23 were masked with the dry films 70. The plated layer 60 and the metal foil layers 21 and 22 were etched to form the outer layer circuits 25 on both faces of the board 40. Then, the dry films 70 were removed.

Portions other than the sections to be soldered were coated by a solder resist 80 containing 0.4% of phthalocyanine blue (manufactured by Taiyo Ink Mfg. Co., Ltd. under the trade name of PSR-4000, BL01). On the sections to be soldered, (i.e., on the plated layers 60 exposed to the surface), a solder coating 90 was applied using a lead-free solder that included Sn-3.2Ag-0.5Cu. Thus, the multilayered printed wiring board of Example 1 was obtained.

Specification of Inorganic Components by Fluorescent X-rays. Measurement of the inorganic components of the insulator layers of the multilayered printed wiring board was performed using fluorescent X-rays to obtain quantitative analysis values of phosphorus, aluminum, silicon, chlorine, calcium, titanium, iron, and strontium. The measured values of the elements were converted to values for phosphorus pentoxide $P_2O_5$, aluminum oxide $Al_2O_3$, silica $SiO_2$, chlorine (Cl), calcium oxide (CaO), titanium oxide $TiO_2$, iron oxide $Fe_2O_3$, and strontium oxide (SrO), respectively. The unit of measurement was percent by mass when the total amount of the epoxy compositions in the insulator layers was taken as 100%. The results are summarized in Table 1.

TABLE 1

|  | $Al_2O_3$ | $SiO_2$ | $P_2O_5$ | Cl | CaO | $TiO_2$ | $Fe_2O_3$ | SrO |
|---|---|---|---|---|---|---|---|---|
| Example 1 | 22 | 0.4 | 14 | 0.8 | 20 | 0.4 | 0.3 | 0.2 |
| Example 2 | 25 | 0.3 | 12 | 0.7 | 16 | 0.3 | 0.3 | 0.2 |
| Comparative Example 1 | 24 | 6 | 8 | 0.3 | 8 | 0.02 | 0.1 | 0.03 |
| Comparative Example 2 | 30 | 0.2 | 7 | 0.8 | 17 | 0.4 | 0.3 | 0.2 |

Example 2

A multilayered printed wiring board was obtained using the manufacturing process of Example 1, except for the addition to the epoxy resin composition of the inorganic components resorcinol phosphate ester of 25.6 parts by mass, aluminum hydroxide of 56.1 parts by mass, silica of 0.5 parts by mass, calcium oxide of 0.3 parts by mass, strontium titanate of 0.65 parts by mass, and iron oxide of 0.39 parts by mass.

Comparative Example 1

A multilayered printed wiring board was obtained using the manufacturing process of Example 1, except for the addition to the epoxy resin composition of the inorganic components resorcinol phosphate ester of 17.1 parts by mass, aluminum hydroxide of 53.9 parts by mass, silica of 90 parts by mass, calcium oxide of 0.2 parts by mass, strontium titanate of 0.007 parts by mass, and iron oxide of 0.44 parts by mass.

Comparative Example 2

A multilayered printed wiring board was obtained using the manufacturing process of Example 1, except for the addition to the epoxy resin composition of the inorganic components resorcinol phosphate ester of 14.9 parts by mass, aluminum hydroxide of 67.3 parts by mass, silica of 0.3 parts by mass, calcium oxide of 0.4 parts by mass, strontium titanate of 0.88 parts by mass, and iron oxide of 0.44 parts by mass.

Examples of Tests

Fire-Resistance Characteristics Test. Fire-resistance characteristics tests as specified under UL-94V0, were performed on the multilayered printed wiring boards of Examples 1 and 2 and Comparative Examples 1 and 2. The results are summarized in Table 2.

Thermal Conductivity Test. Thermal conductivity was measured for the insulator sections of the multilayered printed wiring boards of Examples 1 and 2 and Comparative Examples 1 and 2. The thermal conductivity was measured by a laser flash method at 25° C. in a vacuum environment using TC-7000 manufactured by Shinku Rika Co., Ltd. The results are summarized in Table 2.

Figure 3:
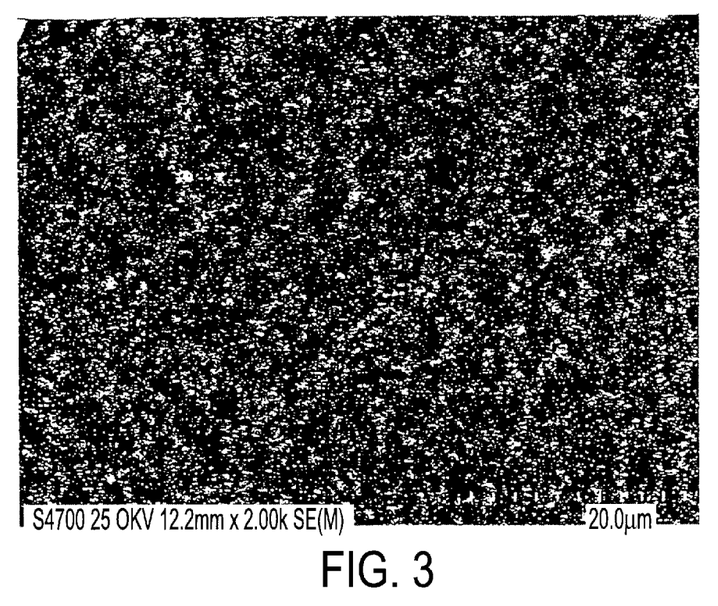
FIG. 3 is a scanning election microscope (SEM) image of a cross section of an insulator layer section in the multilayered printed wiring board according to Example 1 of an embodiment of the present invention.
Figure 4:
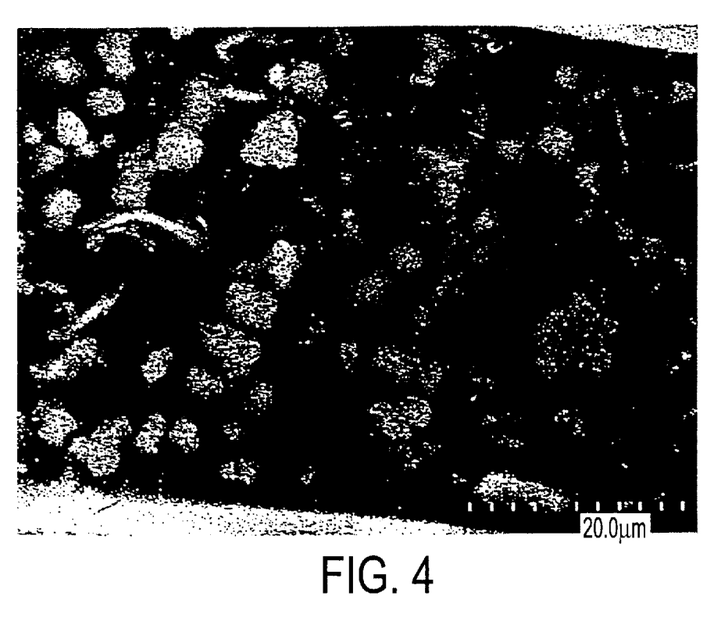
FIG. 4 is a SEM image of a cross section of an insulator layer section in the multilayered printed wiring board according to Comparative Example 1 for an embodiment of the present invention.
Figure 5:
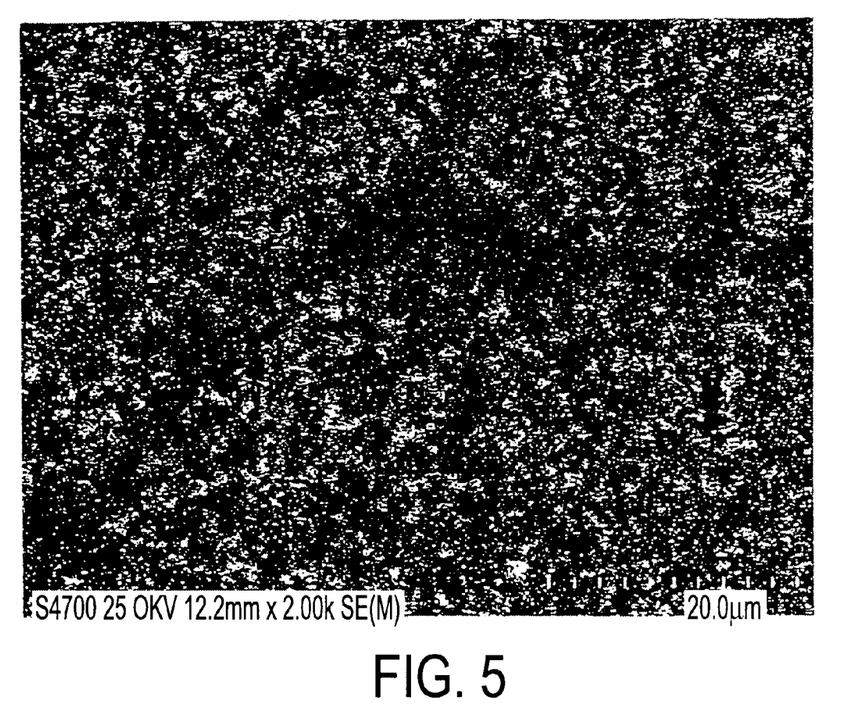
FIG. 5 is a SEM image of a cross section of an insulator layer section in the multilayered printed wiring board according to Comparative Example 2 for an embodiment of the present invention.

Dispersed State of the Inorganic Fillers. For the multilayered printed wiring boards of Examples 1 and 2 and Comparative Examples 1 and 2, cross sections of the insulator layers were observed under a scanning electron microscope (SEM) at X2000 to evaluate the dispersed state of the inorganic fillers. The results are shown in FIGS. 3 through 5.

TABLE 2

|  | Fire-Resistance Characteristics | Thermal Conductivity (w/m/k) |
| --- | --- | --- |
| Example 1 | V0 | 0.45 |
| Example 2 | V0 | 0.44 |
| Comparative Example 1 | V0 | 0.28 |
| Comparative Example 2 | V1 | 0.47 |

As shown in Table 2, for Examples 1 and 2, because the amounts of the inorganic components obtained by fluorescent X-rays were within the ranges described above according to embodiments of the present invention, fire retardancy complies with V0, while providing a thermal conductivity as high as 0.45 W/m/K. This satisfies the requirements of high conductivity and fire-resistance. In addition, it is observed in FIG. 3 that, for Example 1, aluminum hydroxide is almost uniformly dispersed without flocculation.

In Comparative Example 1, in which proportions of the inorganic components were out of the ranges specified according to embodiments of the present invention, although fire retardancy complied with V0, low thermal conductivity was exhibited. Also, from FIG. 4 it is observed that aluminum hydroxide particles flocculate to form resin-rich portions where thermal conductivity is lower.

In Comparative Example 2, in which the amount of aluminum hydroxide and the amount of phosphate ester are out of the ranges specified according to embodiments of the present invention, high thermal conductivity was exhibited without flocculation of aluminum hydroxide as observed in FIG. 5. However, the presence of slightly resin-rich layers caused fire retardancy to be V1.

As described above, according to embodiments of the present invention, a fire retardant multilayered printed wiring board is provided with reduced amounts of halogen compounds and enhanced thermal conductivity of the insulator layers to prevent electronic components from being damaged during soldering, and which also allows for the drilling of through-holes in the board.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A multilayered printed wiring board, comprising:
   a plurality of insulator layers, each formed of a glass cloth impregnated with an epoxy resin composition;
   a plurality of metal foil layers, in each of which a circuit is formed, the metal layers being laminated alternately with the insulator layers, each of the insulator layers being placed between two of the metal layers; and
   a cavity providing continuity between the metal foil layers alternately laminated with the insulator layers,
   wherein the epoxy resin composition comprises at least phosphate ester, aluminum hydroxide, silica, calcium oxide, strontium titanate, and iron oxide, and
   wherein inorganic components are provided in the insulator layers as about 8% to about 18% by mass of phosphorus pentoxide ($P_2O_5$), about 20% to about 28% by mass of aluminum oxide ($Al_2O_3$), about 0.1% to about 0.6% by mass of silica ($SiO_2$), about 0.1% to about 1.0% by mass of chlorine (Cl), about 15% to about 20% by mass of calcium oxide (CaO), about 0.3% to about 0.5% by mass of titanium oxide ($TiO_2$), about 0.2% to about 0.4% by mass of iron oxide ($Fe_2O_3$), and about 0.1% to about 0.3% by mass of strontium oxide (SrO), in converted values as measured by an X-ray fluorescence analysis.

2. The multilayered printed wiring board as claimed in claim 1, wherein the aluminum hydroxide contains particles with irregular shapes having an average particle diameter of about 0.5 μm to about 1.0 μm that are approximately uniformly distributed in each of the insulator layers.

3. The multilayered printed wiring board as claimed in claim 1, wherein, at specified sections in the metal foil layers and the cavity, solder layers without lead are formed.

4. The multilayered printed wiring board as claimed in claim 1, wherein a surface of the multilayered printed wiring board, except for areas to be soldered, is coated with an insulation material containing phthalocyanine blue.

5. The multilayered printed wiring board as claimed in claim 1, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

6. The multilayered printed wiring board as claimed in claim 1, wherein thermal conductivity of each of the insulator layers is about 0.4 to about 0.5 W/m/K.

7. The multilayered printed wiring board as claimed in claim 2, wherein, at specified sections in the metal foil layers and the cavity, solder layers without lead are formed.

8. The multilayered printed wiring board as claimed in claim 2, wherein a surface of the multilayered printed wiring board, except for areas to be soldered, is coated with an insulation material containing phthalocyanine blue.

9. The multilayered printed wiring board as claimed claim 2, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

10. The multilayered printed wiring board as claimed claim 2, wherein thermal conductivity of each of the insulator layers is about 0.4 to about 0.5 W/m/K.

11. The multilayered printed wiring board as claimed in claim 3, wherein a surface of the multilayered printed wiring board, except for areas to be soldered, is coated with an insulation material containing phthalocyanine blue.

12. The multilayered printed wiring board as claimed in claim 3, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

13. The multilayered printed wiring board as claimed claim 3, wherein thermal conductivity of each of the insulator layers is about 0.4 to about 0.5 W/m/K.

14. The multilayered printed wiring board as claimed in claim 4, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

15. The multilayered printed wiring board as claimed claim 4, wherein thermal conductivity of each of the insulator layers is about 0.4 to about 0.5 W/m/K.

16. The multilayered printed wiring board as claimed claim 5, wherein thermal conductivity of each of the insulator layers is about 0.4 to about 0.5 W/m/K.

17. The multilayered printed wiring board as claimed in claim 8, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

18. The multilayered printed wiring board as claimed claim 8, wherein thermal conductivity of each of the insulator layers is about 0.4 to about 0.5 W/m/K.

19. The multilayered printed wiring board as claimed claim 9, wherein thermal conductivity of each of the insulator layers is about 0.4 to about 0.5 W/m/K.

20. The multilayered printed wiring board as claimed in claim 7, wherein a surface of the multilayered printed wiring board, except for areas to be soldered, is coated with an insulation material containing phthalocyanine blue.

21. The multilayered printed wiring board as claimed in claim 7, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

22. The multilayered printed wiring board as claimed claim 7, wherein thermal conductivity of each of the insulator layers is about 0.4 to about 0.5 W/m/K.

23. The multilayered printed wiring board as claimed claim 12, wherein thermal conductivity of each of the insulator layers is about 0.4 to about 0.5 W/m/K.

24. The multilayered printed wiring board as claimed in claim 11, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

25. The multilayered printed wiring board as claimed claim 11, wherein thermal conductivity of each of the insulator layers is about 0.4 to about 0.5 W/m/K.

26. The multilayered printed wiring board as claimed claim 14, wherein thermal conductivity of each of the insulator layers is about 0.4 to about 0.5 W/m/K.

27. The multilayered printed wiring board as claimed claim 17, wherein thermal conductivity of each of the insulator layers is about 0.4 to about 0.5 W/m/K.

28. The multilayered printed wiring board as claimed claim 21, wherein thermal conductivity of each of the insulator layers is about 0.4 to about 0.5 W/m/K.

29. The multilayered printed wiring board as claimed in claim 20, wherein amounts of gases evolved by a burning test at about 600° C., as specified under JIS-K7217, are about 150 µg/g or less of chlorine, about 30 µg/g or less of bromine, about 5 mg/g or less of hydrogen cyanide, and about 5 pg/g or less of polychlorinated dibenzo-p-dioxin and polychlorinated dibenzo furan in mass ratio to the multilayered printed wiring board.

30. The multilayered printed wiring board as claimed claim 20, wherein thermal conductivity of each of the insulator layers is about 0.4 to about 0.5 W/m/K.

31. The multilayered printed wiring board as claimed claim 24, wherein thermal conductivity of each of the insulator layers is about 0.4 to about 0.5 W/m/K.

32. The multilayered printed wiring board as claimed claim 29, wherein thermal conductivity of each of the insulator layers is about 0.4 to about 0.5 W/m/K.

* * * * *

UNITED STATES PATENT AND TRADEMARK OFFICE
CERTIFICATE OF CORRECTION

PATENT NO. : 6,713,163 B2
DATED : March 30, 2004
INVENTOR(S) : Shigemasa Saito

It is certified that error appears in the above-identified patent and that said Letters Patent is hereby corrected as shown below:

Column 13,
Lines 1, 19, 32, 45 and 50, change "C.," to -- C, --.

Column 14,
Lines 13, 28 and 48, change "C.," to -- C, --.

Signed and Sealed this

Seventh Day of September, 2004

JON W. DUDAS
*Director of the United States Patent and Trademark Office*